(12) United States Patent
Lingle et al.

(10) Patent No.: US 7,314,668 B2
(45) Date of Patent: Jan. 1, 2008

(54) LOW-E COATED ARTICLES HAVING ZIRCONIUM INCLUSIVE DIELECTRIC LAYER

(75) Inventors: Philip J. Lingle, Temperance, MI (US); Anton Dietrich, Azmoos (CH); Ronald E. Laird, Dexter, MI (US); Jean-Marc Lemmer, Luxembourg (LU)

(73) Assignees: Guardian Industries Corp., Auburn Hills, MI (US); Centre Luxembourgeois de Recherches pour le Verre et al Ceramique S.A. (C.R.V.C.), Luxembourg (LU)

( * ) Notice: Subject to any disclaimer, the term of this patent is extended or adjusted under 35 U.S.C. 154(b) by 0 days.

(21) Appl. No.: 11/248,302

(22) Filed: Oct. 13, 2005

(65) Prior Publication Data

US 2006/0029816 A1 Feb. 9, 2006

Related U.S. Application Data

(62) Division of application No. 10/453,790, filed on Jun. 4, 2003, which is a division of application No. 09/794,224, filed on Feb. 28, 2001, now Pat. No. 6,576,349, which is a division of application No. 10/337,383, filed on Jan. 7, 2003, now Pat. No. 6,723,211, and a division of application No. 10/337,384, filed on Jan. 7, 2003, now Pat. No. 6,686,050.

(60) Provisional application No. 60/217,101, filed on Jul. 10, 2000.

(51) Int. Cl.
*B32B 17/06* (2006.01)
(52) U.S. Cl. ............... 428/432; 428/428; 428/697; 428/698; 428/699; 428/701; 428/702; 428/704
(58) Field of Classification Search ........... 428/428, 428/432, 697, 698, 699, 701, 702, 704
See application file for complete search history.

(56) References Cited

U.S. PATENT DOCUMENTS 3,682,528 A 8/1972 Apfel et al.

(Continued)

FOREIGN PATENT DOCUMENTS

DE 1 621 347 6/1971

(Continued)

OTHER PUBLICATIONS

U.S. Appl. No. 10/453,790, filed Jun. 4, 2003.

(Continued)

*Primary Examiner*—G. Blackwell
(74) *Attorney, Agent, or Firm*—Nixon & Vanderhye P.C.

(57) ABSTRACT

A heat treatable coated article (e.g., vehicle windshield, IG unit, etc.) is provided with a dual-silver low-E coating. Before and/or after heat treatment (HT), the coating and/or coated article has a visible transmittance of at least 70%, more preferably at least 75%. Moreover, the coating and/or coated article is designed so as to have approximately the same color when viewed over a wide range of viewing angles. In certain embodiments, at least one contact layer (e.g., of or including $NiCrO_x$) that contacts an infrared (IR) reflecting layer (e.g., Ag) is oxidation graded so that it progressively becomes less oxidized through its thickness as it nears the IR reflecting layer. In still other embodiments, a Si-rich silicon nitride layer(s) may be utilized to reduce haze.

10 Claims, 6 Drawing Sheets

U.S. PATENT DOCUMENTS

| | | | |
|---|---|---|---|
| 4,413,877 A | 11/1983 | Suzuki et al. |
| 4,744,880 A | 5/1988 | Gillery et al. |
| 4,782,216 A | 11/1988 | Woodard |
| 4,786,783 A | 11/1988 | Woodard |
| 4,799,745 A | 1/1989 | Meyer et al. |
| 4,806,220 A | 2/1989 | Finley |
| 4,898,789 A | 2/1990 | Finley |
| 4,898,790 A | 2/1990 | Finley |
| 5,028,759 A | 7/1991 | Finley |
| 5,059,295 A | 10/1991 | Finley |
| 5,201,926 A | 4/1993 | Szczyrbowski et al. |
| 5,229,194 A | 7/1993 | Lingle et al. |
| 5,242,560 A | 9/1993 | Lingle et al. |
| 5,262,032 A | 11/1993 | Hartig et al. |
| 5,270,517 A | 12/1993 | Finley |
| 5,298,048 A | 3/1994 | Lingle et al. |
| 5,342,675 A | 8/1994 | Kobayashi et al. |
| 5,364,518 A | 11/1994 | Hartig et al. |
| 5,377,045 A | 12/1994 | Wolfe et al. |
| 5,425,861 A | 6/1995 | Hartig et al. |
| 5,514,476 A | 5/1996 | Hartig et al. |
| 5,557,462 A | 9/1996 | Hartig et al. |
| 5,563,734 A | 10/1996 | Wolfe et al. |
| 5,584,902 A | 12/1996 | Hartig et al. |
| 5,595,825 A | 1/1997 | Guiselin |
| 5,688,585 A | 11/1997 | Lingle et al. |
| 5,770,321 A | 6/1998 | Hartig et al. |
| 5,800,933 A | 9/1998 | Hartig et al. |
| 5,811,191 A | 9/1998 | Neuman |
| 5,821,001 A | 10/1998 | Arbab et al. |
| 5,834,103 A | 11/1998 | Bond et al. |
| 5,897,372 A | 4/1999 | Howard |
| 5,902,505 A | 5/1999 | Finley |
| 5,942,338 A | 8/1999 | Arbab et al. |
| 5,952,084 A | 9/1999 | Anderson et al. |
| 6,014,872 A | 1/2000 | Hartig et al. |
| 6,045,896 A | 4/2000 | Boire et al. |
| 6,059,909 A | 5/2000 | Hartig et al. |
| 6,060,178 A | 5/2000 | Krisko |
| 6,086,210 A | 7/2000 | Krisko et al. |
| 6,090,481 A | 7/2000 | Depauw et al. |
| 6,114,043 A | 9/2000 | Joret |
| 6,132,881 A | 10/2000 | Hartig et al. |
| 6,142,642 A | 11/2000 | Krisko et al. |
| 6,159,607 A | 12/2000 | Hartig et al. |
| 6,190,776 B1 | 2/2001 | Demiryont |
| 6,306,525 B1 | 10/2001 | Schicht et al. |
| 6,316,111 B1 | 11/2001 | Krisko |
| 6,322,881 B1 | 11/2001 | Boire et al. |
| 6,340,529 B1 | 1/2002 | Ebisawa et al. |
| 6,354,109 B1 | 3/2002 | Boire et al. |
| 6,355,334 B1 | 3/2002 | Rondeau et al. |
| 6,472,072 B1 * | 10/2002 | Ebisawa et al. ............ 428/432 |
| 6,472,636 B1 | 10/2002 | Baldwin |
| 6,492,619 B1 | 12/2002 | Sol |
| 6,524,714 B1 | 2/2003 | Neuman et al. |
| 6,558,800 B1 | 5/2003 | Stachowiak |
| 6,576,349 B2 | 6/2003 | Lingle et al. |
| 6,686,050 B2 | 2/2004 | Lingle et al. |
| 6,723,211 B2 | 4/2004 | Lingle et al. |
| 2001/0041252 A1 | 11/2001 | Laird |
| 2002/0031674 A1 | 3/2002 | Laird |
| 2002/0102352 A1 * | 8/2002 | Hartig et al. ............... 428/699 |
| 2002/0136905 A1 | 9/2002 | Medwick et al. |
| 2002/0192473 A1 | 12/2002 | Gentilhomme et al. |

FOREIGN PATENT DOCUMENTS

| | | |
|---|---|---|
| DE | 42 11 363 | 6/1971 |
| EP | 0 857 700 A1 | 8/1998 |
| EP | 0 963 960 A1 | 12/1999 |
| EP | 0 999 192 A1 | 5/2000 |
| WO | WO 98/58885 | 12/1998 |
| WO | WO 01/21540 | 3/2001 |

OTHER PUBLICATIONS

U.S. Appl. No. 60/217,101, filed Jul. 10, 2001.

"Heat Insulating Glass Which Can Be Thermally Worked", Hironobu, 05124839, Oct. 1991.

* cited by examiner

LOW-E COATED ARTICLES HAVING ZIRCONIUM INCLUSIVE DIELECTRIC LAYER

This application is a divisional of U.S. patent application Ser. No. 10/453,790, filed Jun. 4, 2003, which is a divisional and claims priority on each of U.S. patent application Ser. No. 09/794,224, filed Feb. 28, 2001 (U.S. Pat. No. 6,576,349), Ser. No. 10/337,383, filed Jan. 7, 2003 (U.S. Pat. No. 6,723,211), and Ser. No. 10/337,384, filed Jan. 7, 2003 (U.S. Pat. No. 6,686,050), each of which claims priority on U.S. Provisional Patent Application No. 60/217,101, filed Jul. 10, 2000, the disclosures of which are all hereby incorporated herein by reference.

This invention relates to heat treatable (low-E) coated articles, and methods of making the same. Such coated articles may be used in the context of vehicle windshields, insulating glass (IG) units, and other suitable applications.

BACKGROUND OF THE INVENTION

Layer coatings provided for solar management purposes are known in the art. Such coatings often seek to reflect infrared (IR) radiation while at the same time enabling a high amount of visible light transmittance. In the automobile industry, for example, vehicle windshields often must have a visible light transmittance of at least 70% in the United States, and at least 75% in Europe, even when laminated with a polyvinyl butyral (PVB) layer provided between opposing glass substrates. This need for high visible transmittance often conflicts with the need for good IR reflection, and it is difficult to obtain both simultaneously. Making low-E coating designs more difficult is the need for a mechanically and/or chemically durable coating, as well as the need for a coating with low visible reflectance (glass side) that does not suffer radical color change when viewed at different viewing angles. It is also desirable for such coatings to be heat treatable, so that they may be used in vehicle windshields where heat bending is required, tempered IG units, and the like.

U.S. Pat. No. 5,584,902 (commonly owned herewith) discloses a low-E coating system including, from the glass substrate outward, a stack of: $Si_3N_4/NiCr/Ag/NiCr/Si_3N_4$. Unfortunately, while this coating is heat treatable and low-E in nature, it is characterized by rather high emissivity and/or sheet resistance values which lead to rather low $R_{solar}$ (total solar energy reflectance) values around 22-24%. For example, one coating reported in the '902 patent had a sheet resistance ($R_s$) of 14.4 ohms/square and a normal emissivity ($E_n$) of 0.15 before heat treatment; and a $R_s$ of 10.5 ohms/square and a $E_n$ of 0.11 after heat treatment.

U.S. Pat. No. 5,557,462 (commonly owned herewith) discloses a dual silver low-E coating including from the glass outwardly a stack of:

$Si_3N_4/NiCr/Ag/NiCr/Si_3N_4/NiCr/Ag/NiCr/Si_3N_4$. The coating system of the '462 patent is characterized by good emissivity values and good $R_{solar}$ values. Unfortunately, the coating systems described in the '462 patent are not heat treatable (e.g., upon heat treatment $R_s$ goes way up, such as from about 3-5 to well over 10, and haze tends to set in). Because the coatings described in the '462 patent are not heat treatable, as a practical matter they cannot be used in applications such as vehicle windshields (where heat bending is required) or other applications requiring heat treatment (HT) such as tempering, heat strengthening, or bending.

Certain other dual-silver coatings are described in the background section of the aforesaid provisional application. See also U.S. Pat. No. 6,060,178. Unfortunately, these coating systems are plagued by poor durability before and/or after heat treatment.

SUMMARY OF THE INVENTION

An object of certain exemplary embodiments of this invention is to provide a heat treatable low-E coating (or layer system) which is mechanically and/or chemically durable before and after heat treatment, the coating system having a visible transmittance of at least about 70%.

Another object of certain exemplary embodiments of this invention is to provide a dual silver low-E coating which is heat treatable and is mechanically and chemically durable.

Another object of certain exemplary embodiments of this invention is to provide a dual-silver low-E coating including at least one oxidation graded contact layer which contacts an IR reflecting layer, where the degree of oxidation in the contact layer is graded or changes throughout the thickness of the layer. Graded contact layer(s) can help enable the coating to have high visible transmittance coupled with heat treatability.

Another object of certain exemplary embodiments of this invention is to provide a coating including a Ni or NiCr inclusive contact layer(s) (e.g., $NiCrO_x$ layer) which is oxidation graded in thickness so that one portion of the layer is more oxidized than another portion of the layer. Again, it is believed that graded contact layer(s) can help enable the ohms/sq., and most preferably no greater than about 5.0 ohms/sq.) before heat treatment; and/or a $R_s$ of no greater than 8.0 ohms/sq. (more preferably no greater than 6.0 ohms/sq., and most preferably no greater than about 4.0 ohms/sq.) after heat treatment.

Another object of certain exemplary embodiments of this invention is to provide a heat treatable low-E coating which is characterized by substantial reflective color stability with shifts in viewing angle (VA). For example, in certain exemplary embodiments, coated articles of this invention may experience a glass side reflective color coordinate a* shift (i.e., Δa*) of no more than 4.0, more preferably no more than 3.0, and most preferably no more than 2.0, given a VA shift of about 60 degrees.

Another object of certain exemplary embodiments of this invention is to provide a heat treatable low-E dual silver coating with a glass side reflective color coordinate a* value within the range of from −2.0 to 2.0 before and/or after a 60 degree VA shift from normal, so as to minimize or reduce color change detectable by the human naked eye.

Another object of certain exemplary embodiments of this invention is to provide a heat treatable low-E dual silver coating having a haze value after heat treatment of no greater than 0.40, more preferably no greater than 0.30 (monolithic and/or in the context of a laminate such as a windshield).

Another object of certain exemplary embodiments of this invention is to provide a heat treated laminated article having a dual silver low-E coating, with a glass side visible reflectance ($R_gY$) (Ill. C, 2 degree) of no greater than 11%, more preferably no greater than about 9.0%, and most preferably no greater than 8.5%. coating to have high visible transmittance coupled with heat treatability.

Another object of certain exemplary embodiments of this invention is to utilize a silicon nitride layer in a layer stack in order to reduce haze experienced upon heat treatment. This silicon nitride layer may be Si-rich in certain embodiments.

Another object of certain exemplary embodiments of this invention is to provide a heat treatable dual-silver coating/layer system designed to: a) be mechanically durable, b) have a visible transmittance of at least about 70%, more preferably of at least about 75%, and c) have a $R_{solar}$ value of at least about 26%, more preferably of at least about 28%, and most preferably of at least about 29%.

Another object of certain exemplary embodiments of this invention is to provide a coating according to one or more of the above-listed objects which may be used in the context of an IG window unit and/or a vehicle windshield.

Another object of certain exemplary embodiments of this invention is to provide a heat treatable low-E coating having high visible transmittance combined with a normal emissivity ($E_n$) of no greater than 0.08 (more preferably no greater than 0.06) before heat treatment, and/or an $E_n$ of no greater than 0.07 (more preferably no greater than 0.05) after heat treatment (HT).

Another object of certain exemplary embodiments of this invention is to provide a heat treatable low-E coating having high visible transmittance combined with a sheet resistance ($R_s$) of no greater than 10.0 ohms/sq. (more preferably no greater than 8.0

Another object of this invention is to fulfill one or more of the above-listed objects.

Generally speaking, certain example embodiments of this invention fulfill one or more of the above-listed objects by providing a coated article including a coating supported by a glass substrate, the coating comprising:

an infrared (IR) reflecting layer contacting and sandwiched between first and second layers, said second layer comprising $NiCrO_x$; and wherein at least said second layer comprising $NiCrO_x$ is oxidation graded so that a first portion of said second layer close to said infrared (IR) reflecting layer is less oxidized than a second portion of said second layer that is further from said infrared (IR) reflecting layer.

Certain other example embodiments of this invention fulfill one or more of the above-listed objects or needs by providing a coated article including a coating supported by a substrate, the coating comprising:

a metallic infrared (IR) reflecting layer contacting and sandwiched between first and second contact layers; and wherein said second contact layer is oxidation graded and becomes progressively more oxidized through its thickness proceeding further from said infrared (IR) reflecting layer.

Certain other example embodiments of this invention fulfill one or more of the above-listed needs or objects by providing a coated article comprising:

a coating provided on a glass substrate, said coating comprising from the glass substrate outwardly:

a) at least one dielectric layer;
b) a first contact layer that is at least partially oxidized;
c) a first IR reflecting layer comprising Ag;
d) a second contact layer that is at least partially oxidized, said first IR reflecting layer contacting each of said first and second contact layers;
e) at least one additional dielectric layer;
f) a third contact layer that is at least partially oxidized;
g) a second IR reflecting layer comprising Ag;
h) a fourth contact layer that is at least partially oxidized, said second IR reflecting layer contacting each of said third and fourth contact layers;
i) at least one additional dielectric layer;

wherein after being heat treated (HT) and laminated said coated article has a visible transmittance of at least about 70%, a $T_{solar}$ no greater than about 50%, an $R_{solar}$ of at least 26%, and a sheet resistance ($R_s$) of no greater than 8.0 ohms/sq; and wherein at least two of said first, second, third and fourth contact layers comprise at least Ni or a Ni alloy.

Certain other example embodiments of this invention fulfill one or more of the above listed needs or objects by providing a coated article comprising:

a coating provided on a glass substrate, said coating comprising from the glass substrate outwardly:

a) at least one dielectric layer comprising silicon nitride:
b) a first contact layer comprising Ni or a Ni alloy at least partially oxidized;
c) a first IR reflecting layer comprising Ag;
d) a second contact layer comprising Ni or a Ni alloy at least partially oxidized;
e) at least one additional dielectric layer;
f) a third contact layer comprising Ni or a Ni alloy at least partially oxidized;
g) a second IR reflecting layer comprising Ag;
h) a fourth contact layer comprising Ni or a Ni alloy at least partially oxidized;
i) at least one additional dielectric layer;

wherein after being heat treated (HT) said coated article has a visible transmittance of at least 70%, a $T_{solar}$ no greater than 50%, an $R_{solar}$ of at least 26%, and a sheet resistance ($R_s$) of no greater than 8.0 ohms/sq.

Certain other example embodiments of this invention fulfill one of more of the above-listed needs or objects by providing a method of sputtering an oxidation graded layer, the method comprising:

providing a substrate;

providing a sputtering apparatus including at least one target:

directing a first gas portion proximate a first side of the target and a second gas portion proximate a second side of the target, the first gas portion including more oxygen than the second gas portion so that as the substrate passes below the target an oxidation graded layer is formed on an IR reflecting layer, the oxidation graded layer being more oxidized at one portion thereof than at another portion thereof.

Certain other embodiments of this invention fulfill one or more of the above listed objects by providing a coated article comprising:

a layer system supported by a glass substrate, the layer system comprising from the substrate outwardly:

a Si-rich silicon nitride $Si_xN_y$ layer where x/y is from 0.76 to 1.5 in at least part of the layer;

a first contact layer; and an IR reflecting layer.

In different embodiments of this invention, part of all of Si-rich silicon nitride layers may be Si-rich.

This invention will now be described with respect to certain example embodiments thereof as illustrated in the following drawings, wherein:

IN THE DRAWINGS

DETAILED DESCRIPTION OF CERTAIN EXEMPLARY EMBODIMENTS OF THE INVENTION

Figure 1:
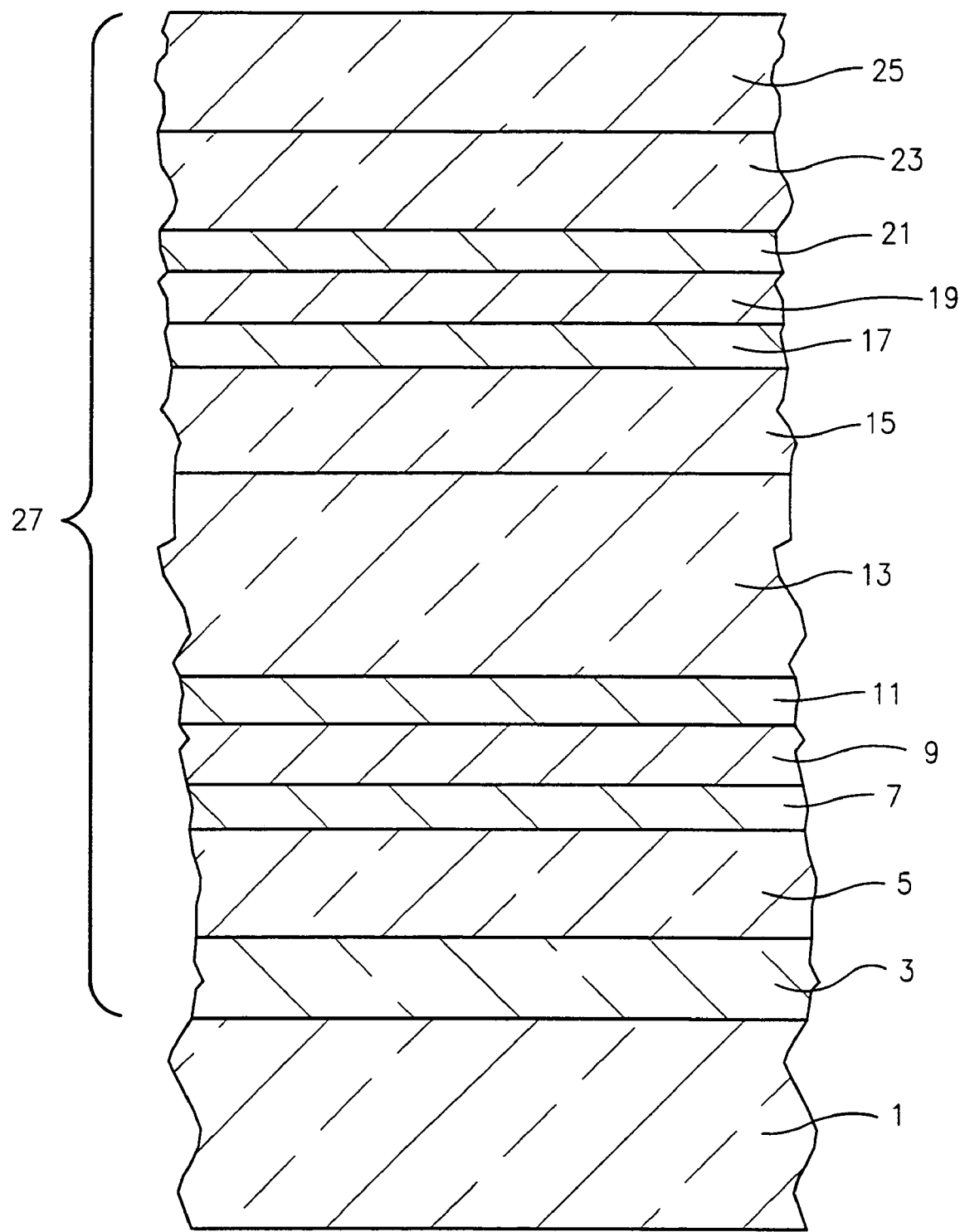
FIG. 1 is a side cross sectional view of a coated article according to an embodiment of this invention.

Referring now more particularly to the accompanying drawings in which like reference numerals indicate like parts or layers throughout the several views.

Certain embodiments of this invention provide a low-E coating or layer system that may be used in applications such as vehicle windshields, other vehicle windows, skylights, glass doors, IG units, and the like. Coatings according to certain embodiments of this invention preferably have low-E characteristics as well as high visible transmittance, and are heat treatable. Preferably, coatings of certain embodiments herein are mechanically durable before and/or after heat treatment (HT), and HT does not cause a significant jump in sheet resistance ($R_s$) and/or haze. As is known in the art, such HT often necessitates heating the coated substrate to temperatures of from 1100° F. (593° C.) to 1450° F. (788° C.) for a sufficient period of time to attain the desired result (e.g., tempering, bending, and/or heat strengthening).

FIG. 1 is a side cross sectional view of a coated article according to an embodiment of this invention. The coated article includes substrate 1 (e.g., clear, green, bronze, or blue-green glass substrate from about 1.0 to 10.0 mm thick, more preferably from about 1.8 mm to 4 mm thick), first dielectric anti-reflection layer 3, second dielectric haze-reducing layer 5, first lower contact layer 7 (which contacts layer 9), first conductive metallic infrared (IR) reflecting layer 9, first upper contact layer 11 (which contacts layer 9), third dielectric layer 13 (which may be deposited in one or multiple steps in different embodiments of this invention), fourth dielectric layer 15, second lower contact layer 17 (which contacts layer 19), second conductive metallic IR reflecting layer 19, second upper contact layer 21 (which contacts layer 19), fifth dielectric layer 23, and finally sixth protective dielectric layer 25. The "contact" layers each contact at least one IR reflecting layer. The aforesaid layers 3-25 make up heat treatable low-E (i.e., low emissivity) coating 27 which is provided on glass or plastic substrate 1.

In certain embodiments of this invention, first dielectric layer 3 may be of or include titanium dioxide ($TiO_x$ where x is from 1.7 to 2.3, most preferably 2.0), silicon nitride ($Si_xN_y$ where x/y may be about 0.75 (i.e., $Si_3N_4$), or alternatively x/y may be from about 0.76 to 1.5 in Si-rich embodiments), silicon dioxide ($SiO_x$ where x is from 1.7 to 2.3, most preferably about 2.0), niobium oxide (e.g., $Nb_2O_5$), SiZrN, tin oxide, zinc oxide, silicon oxynitride, or any other suitable dielectric material. First dielectric layer 3 functions as an antireflection layer in certain embodiments of this invention.

Second dielectric layer 5 may function to reduce haze in certain embodiments of this invention, and is preferably of or includes silicon nitride (e.g., $Si_3N_4$, or alternatively silicon-rich silicon nitride $Si_xN_y$ where x/y is from 0.76 to 1.5, more preferably from 0.85 to 1.2). When sputtering silicon nitride layer(s) herein, a Si target may be used, or alternative a target including Si admixed with up to 3-20% by weight aluminum and/or stainless steel (e.g. SS#316) may be used, with about this amount of aluminum and/or steel then appearing in the layer(s) so formed. Other materials may also be used for haze reducing layer 5, including but not limited to SiZrN.

Figure 5:
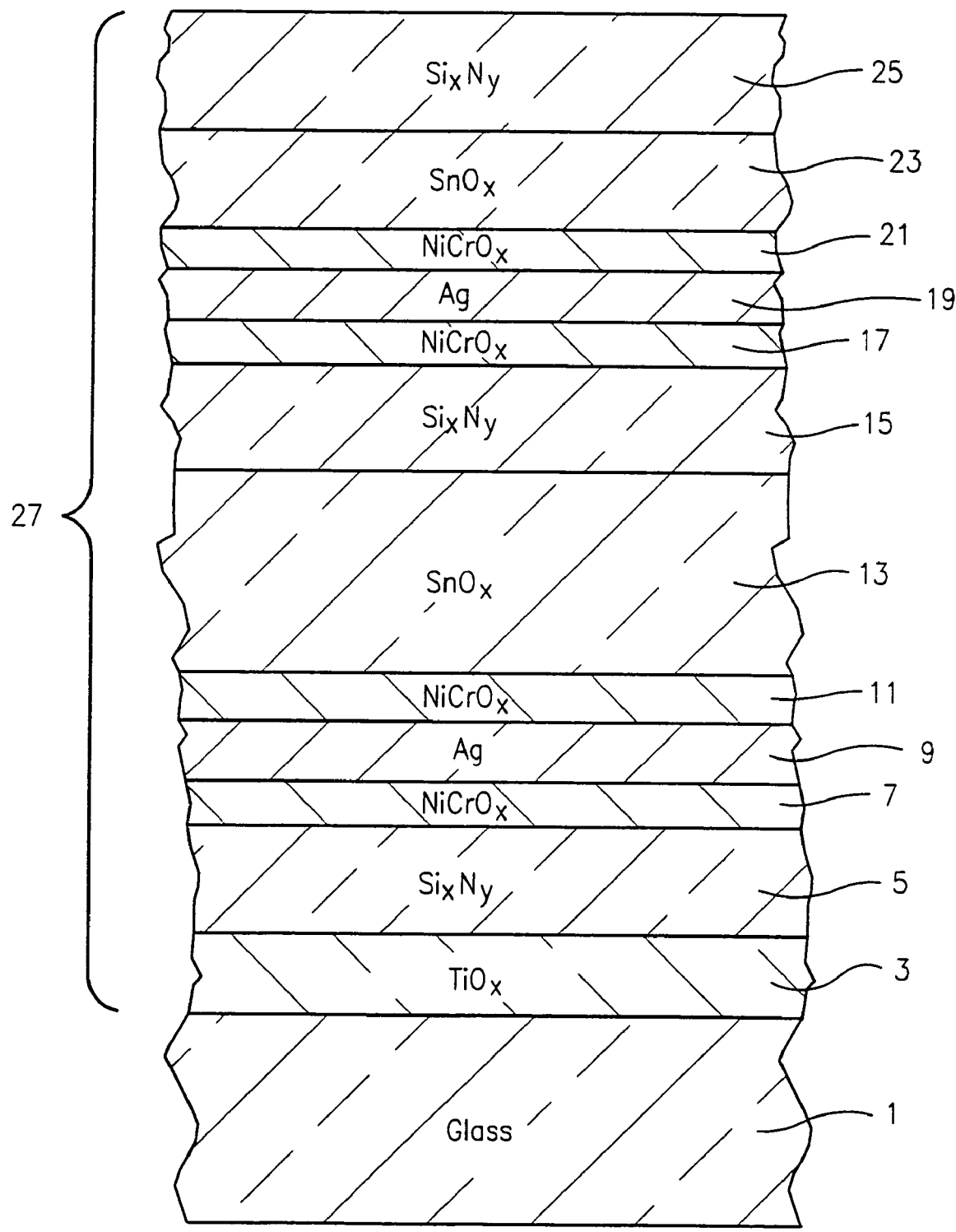
FIG. 5 is a cross sectional view of the layer stack of coatings of Examples 1-3.
Figure 6:
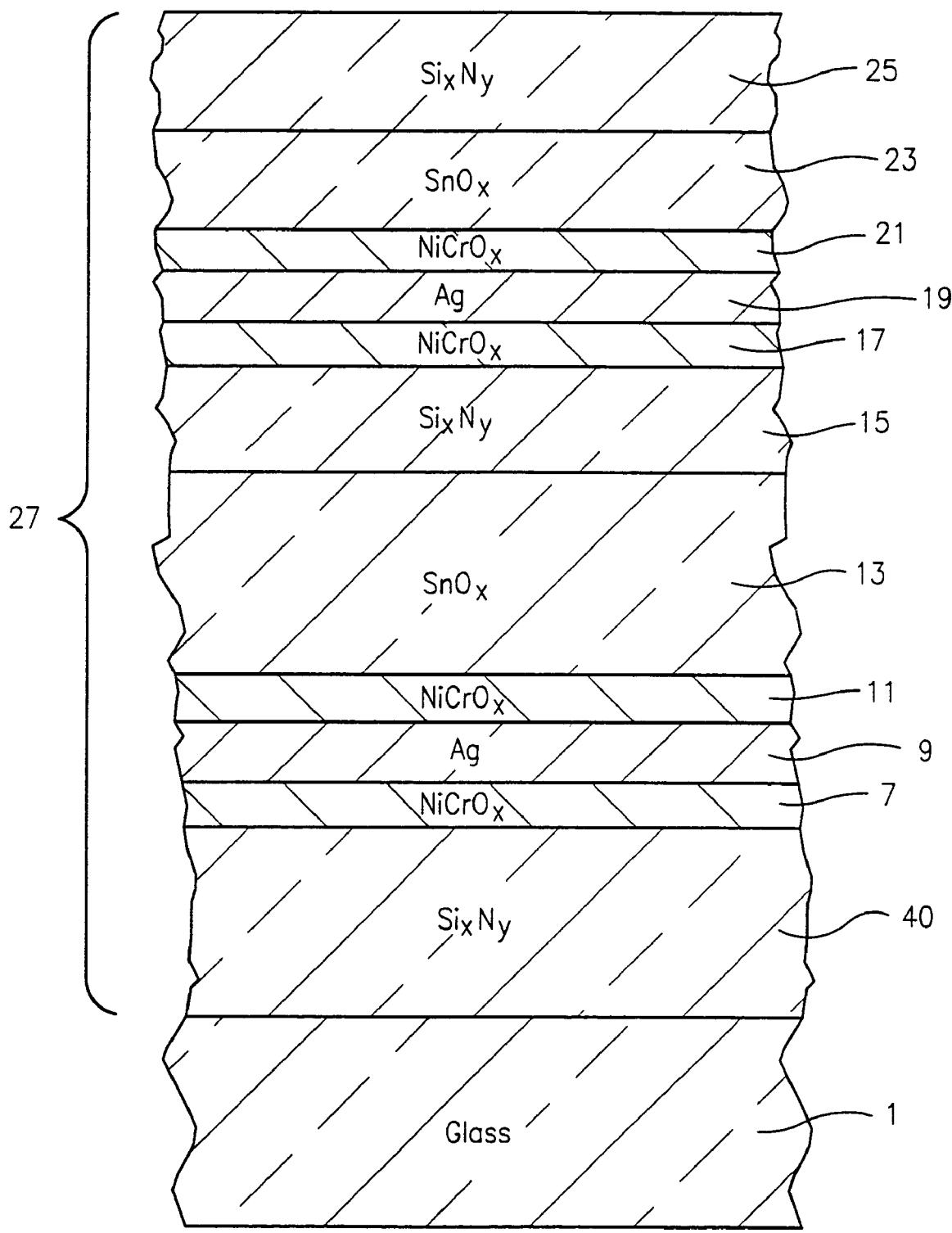
FIG. 6 is a cross sectional view of a coated article according to another embodiment of this invention.

While $Si_3N_4$ may be used for layer 5 (and/or layer 15) in certain embodiments, it has been found that a silicon rich type of silicon nitride as layer 5 is better at reducing haze and/or improving mechanical durability in certain embodiments of this invention. Absent this layer 5 (and/or 15), haze tends to be at least 0.45; whereas with this layer(s) it is reduced to no greater than 0.4 as discussed herein. In Si-rich silicon nitride embodiments, layer 5 (and/or layer 15) is of or includes $Si_xN_y$, where x/y is from 0.76 to 1.5, more preferably from about 0.85 to 1.2. $Si_3N_4$ has an index of refraction "n" of about 2.04, and an extinction coefficient "k" of about 0. However, Si-rich silicon nitride according to certain embodiments of this invention may have an index of refraction of at least about 2.05, more preferably of at least about 2.07, and may be 2.08 (at 632 nm) in exemplary embodiments. Also, Si-rich silicon nitride according to certain embodiments of this invention may have an extinction coefficient "k" of at least about 0.001, and more preferably of at least about 0.0.003. In a first monolithic example after HT of a Si-rich nitride layer 5 (and/or 15), "n" was 2.099 and "k" was 0.0034; while in a second monolithic example after HT "n" was 2.168 and "k" was 0.014. Si-rich silicon nitride, in addition to being better at reducing haze than $Si_3N_4$, has also been found to adhere better to the titanium oxide of layer 3 in example embodiments. Surprisingly, it has also been found that Si-rich silicon nitride under the $NiCrO_x$ and Ag layers in FIGS. 1, 5 and 6 provides a lower sheet resistance ($R_s$).

Infrared (IR) reflecting layers 9 and 19 are preferably metallic and conductive, and may be made of or include silver (Ag), gold, or any other suitable IR reflecting material. However, metallic Ag is the material of choice for the IR reflecting layers 9 and 19 in certain example embodiments of this invention. These IR reflecting layers help enable coating 27 to have low-E characteristics.

Contact layers 7, 11, 17, and 21 are of or include nickel (Ni) oxide, or a nickel alloy oxide such as nickel chrome oxide ($NiCrO_x$), in preferred embodiments of this invention. $NiCrO_x$ layers 7, 11, 17, and/or 21 may be fully oxidized in certain embodiments of this invention (i.e., fully stochiometric), or may be at least about 75% oxidized in other embodiments of this invention. While $NiCrO_x$ is a preferred material for layers 7, 11, 17 and/or 21, those skilled in the art will recognized that other materials may instead be used (e.g., oxides of Ni, oxides of Ni alloys, oxides of Cr, oxides of Cr alloys, $NiCrO_xN_y$, or any other suitable material) for one or more of these layers. It is noted that contact layers 7, 11, 17 and/or 21 may or may not be continuous in different embodiments of this invention.

When layers 7, 11, 17 and/or 21 comprise $NiCrO_x$ in certain embodiments, the Ni and Cr may be provided in different amounts, such as in the form of nichrome by weight about 80-90% Ni and 10-20% Cr. An exemplary sputtering target for depositing these layers includes not only SS-316 which consists essentially of 10% Ni and 90% other ingredients, mainly Fe and Cr, but Haynes 214 alloy as well, which by weight consists essentially of (as a nominal composition) the following materials which may also show up in these layers:

| Element | Weight % |
|---|---|
| Ni | 75.45 |
| Fe | 4.00 |
| Cr | 16.00 |
| C | .04 |
| Al | 4.50 |
| Y | .01 |

One or more of contact layers 7, 11, 17, and/or 21 (e.g., of or including $NiCrO_x$) is/are preferably oxidation graded in certain embodiments of this invention so that the degree of oxidation in the layer(s) changes throughout the thickness of the layer(s). For example, one or more of contact layers (7, 11, 17 and/or 21) may be graded so as to be less oxidized at the contact interface with the immediately adjacent IR reflecting layer (9 or 19) than at a portion of the contact layer(s) further or more/most distant from the immediately adjacent IR reflecting layer. It is believed that oxidation grading of one or more of contact layer(s) 7, 11, 17 and/or 21 enables the low-E coating 27 to achieve the combination of heat treatability and high visible transmission (which was not previously achievable using $NiCrO_x$ contact layers in a dual silver low-E coating system; e.g., see the aforesaid '462 patent). This will be explained in more detail below with reference to FIGS. 3(a) and 3(b).

Turning back to FIG. 1, third dielectric layer 13 acts as a coupling layer between the two halves of the coating 27, and is of or includes tin oxide in certain embodiments of this invention. However, other dielectric materials may instead be used for layer 13, including but not limited to silicon nitride, titanium dioxide, niobium oxide, silicon oxynitride, zinc oxide, or the like. Fourth dielectric layer 15 functions as a haze reducer in certain embodiments of this invention, and is preferably of or includes silicon nitride (e.g. $Si_3N_4$, or alternatively silicon-rich silicon nitride discussed above). However, in alternative embodiments of this invention, other materials (e.g., SiZrN) may instead be used for dielectric layer 15.

Fifth dielectric layer 23 may be of or include tin oxide in certain embodiments of this invention. However, other dielectric materials may instead be used for layer 23, including but not limited to silicon nitride, titanium dioxide, niobium oxide, silicon oxynitride, zinc oxide, or the like. Protective overcoat dielectric layer 25 is provided at least for durability purposes, and may be of or include silicon nitride (e.g., $Si_3N_4$) in certain embodiments of this invention. However, other dielectric materials may instead be used for layer 25, including but not limited to titanium dioxide, silicon oxynitride, tin oxide, zinc oxide, niobium oxide, SiZrN, or the like.

Other layer(s) below or above the illustrated coating 27 may also be provided. Thus, while the layer system or coating 27 is "on" or "supported by" substrate 1 (directly or indirectly), other layer(s) may be provided therebetween. Thus, for example, coating 27 of FIG. 1 may be considered "on" and "supported by" the substrate 1 even if other layer(s) are provided between layer 3 and substrate 1. Moreover, certain layers of coating 27 may be removed in certain embodiments, while others may be added in other embodiments of this invention without departing from the overall spirit of certain embodiments of this invention.

Figure 2:
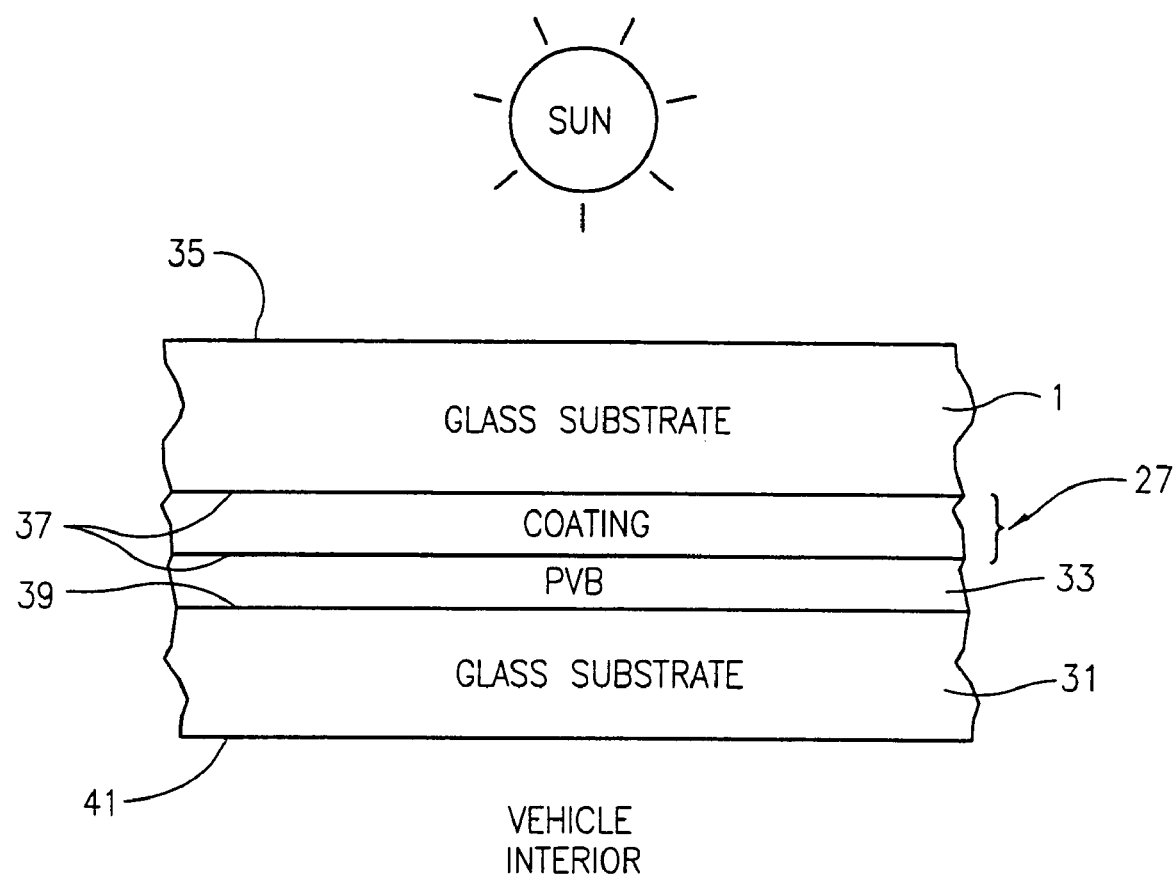
FIG. 2 is a schematic partial cross sectional view of a laminated vehicle windshield according to an embodiment of this invention, in which coatings according to any embodiment of this invention may be used.

FIG. 2 illustrates a laminate (e.g., vehicle windshield) according to an embodiment of this invention, including coating 27 of FIG. 1. As shown in FIG. 2, the laminate (e.g., windshield) includes first glass substrate 1 on which coating 27 is provided, and second glass substrate 31. PVB layer 33 is provided between the substrates in a known manner, so as to contact coating 27 on one side thereof. In the FIG. 2 embodiment, coating 27 is provided at/on the second (or #2) surface 37 of the laminate. The first surface 35 is at the exterior of the laminate exposed to the outside of the vehicle, second surface 37 is on the interior or inside of outer substrate 1, third surface 39 is on the inside of the interior substrate 31, and fourth surface 41 is at the interior of the vehicle. Coatings 27 herein are preferably provided on either the second 37 or third 39 surface(s) of such laminates (the same is also true with regard to IG units).

Turning back to FIG. 1, while various thicknesses may be used consistent with one or more of the objects discussed herein, exemplary preferred thicknesses and example materials for the respective layers on the glass substrate 1 in the FIG. 1 embodiment are as follows:

TABLE 1

(Example Materials/Thicknesses: FIG. 1 Embodiment)

| Layer | Preferred Range (Å) | More Preferred (Å) | Example (Å) |
|---|---|---|---|
| $TiO_2$ (layer 3) | 0-400 Å | 50-250 Å | 100 Å |
| $Si_xN_y$ (layer 5) | 0-400 Å | 50-250 Å | 170 Å |
| $NiCrO_x$ (layer 7) | 5-100 Å | 10-50 Å | 18 Å |
| Ag (layer 9) | 50-250 Å | 80-120 Å | 105 Å |
| $NiCrO_x$ (layer 11) | 5-100 Å | 10-50 Å | 16 Å |
| $SnO_2$ (layer 13) | 0-800 Å | 500-850 Å | 650 Å |
| $Si_xN_y$ (layer 15) | 0-800 Å | 50-250 Å | 170 Å |
| $NiCrO_x$ (layer 17) | 5-100 Å | 10-50 Å | 18 Å |
| Ag (layer 19) | 50-250 Å | 80-120 Å | 105 Å |
| $NiCrO_x$ (layer 21) | 5-100 Å | 10-50 Å | 16 Å |
| $SnO_2$ (layer 23) | 0-500 Å | 100-300 Å | 150 Å |
| $Si_3N_4$ (layer 25) | 0-500 Å | 100-300 Å | 250 Å |

FIG. 6 illustrates a low-E heat treatable coating 27 according to another embodiment of this invention. The FIG. 6 coating 27 is the same as the FIG. 1 coating described above, except that either (i) dielectric layer 3 is removed, or (ii) layers 3 and 5 are replaced with a single silicon nitride layer 40. Silicon nitride layer 40 may be of or include $Si_3N_4$ in certain embodiments of this invention. In other embodiments, silicon nitride layer 40 may be of or include $Si_xN_y$, where x/y may be from about 0.65 to 0.80, or alternatively from about 0.76 to 1.5 in silicon rich embodiments. In another embodiment of the particular FIG. 6 embodiment, layer 40 may be of or include SiZrN. Nitride layer 40 is advantageous because if functions to reduce haze, and is preferably from about 10 to 500 Å thick, more preferably from about 200-400 Å thick. In this embodiment, upper IR reflecting layer 19 may also be thickened by about 0 to 10 Å, and/or the top dielectric 25 may be thickened by about 0-10%. In another aspect of the FIG. 6 embodiment, silicon nitride may be used for layer 40 but in a manner such that the lower portion of the layer is of or includes $Si_3N_4$, while the upper portion is of the silicon rich type silicon nitride discussed above. As with all embodiments herein, Si-rich silicon nitride has improved performance in reducing haze compared to $Si_3N_4$. The FIG. 6 embodiment tends to have reduced visible transmission (but still at least 70%) relative to the FIG. 1 embodiment, but may be more durable under certain circumstances, and $R_{solar}$ may be higher than in the FIG. 1 embodiment which is of course beneficial.

In certain exemplary embodiments of this invention, coating/layer systems 27 according to all embodiments above have the following low-E characteristics before/after heat treatment (HT) when in monolithic form, as set forth in Table 2:

TABLE 2

Monolithic Before/After Heat Treatment (HT)

| Characteristic | General | More Preferred | Most Preferred |
|---|---|---|---|
| $R_s$ (ohms/sq.)(before HT): | <= 10.0 | <= 8.0 | <= 5.0 |
| $R_s$ (ohms/sq.)(after HT): | <= 8.0 | <= 6.0 | <= 4.0 |
| $E_n$ (before HT): | <= 0.08 | <= 0.06 | n/a |
| $E_n$ (after HT): | <= 0.07 | <= 0.05 | n/a |
| Haze (after HT): | <= 0.40 | <= 0.30 | <= 0.28 |

Coatings 27 according to certain exemplary embodiments of this invention (e.g., FIGS. 1-6) have the following color/transmission/reflection/haze characteristics (e.g., preferred greyish color can be seen below) when on a clear soda lime silica glass substrate (e.g., 2.1 mm thick) in laminated form with another similar clear soda lime silica glass substrate (e.g., in the form of a vehicle windshield with PVB or index oil between the two substrates) as shown in FIG. 2 (i.e., on the #2 surface of the laminate), as set forth in Table 3. In Table 3 below, $R_gY$ is visible reflection from the exterior of the vehicle as shown in FIG. 2, and $R_fY$ is visible reflection from the other side of the laminate such as from the vehicle interior in FIG. 2, and the a*, b* values under these respective reflection parameters also correspond to glass (g) side (e.g., outside vehicle in FIG. 2) and film (f) side (e.g., vehicle interior in FIG. 2), respectively.

TABLE 3

Color/Transmission After HT: Laminated Form

| Characteristic | General | More Preferred |
|---|---|---|
| $T_{vis}$ (Ill. A, 2 deg.): | >= 70% | >= 75% (FIG. 1 only) |
| $T_{vis}$ (Ill. C, 2 deg.): | >= 70% | >= 75% (FIG. 1 only) |
| $R_gY$ (Ill. A, C; 2 deg.): | <= 11% | <= 9% |
| $a*_g$ (Ill. A, C; 2°): | -2.0 to +2.0 | -1.0 to +1.0 |
| $b*_g$ (Ill. A, C; 2°): | -10.0 to +1.0 | -8.0 to -2.0 |
| $R_fY$ (Ill. A, C; 2 deg.): | <= 11% | <= 9% |
| $a*_f$ (Ill. A, C; 2°): | -3.0 to +1.0 | -2.0 to 0.0 |
| $b*_f$ (Ill. A, C; 2°): | -5.0 to 0.0 | -4.0 to -1.0 |
| $R_{solar}$: | >= 26% | >= 28% |
| Haze: | <= 0.4 | <= 0.3 |
| $T_{solar}$: | <= 50% | <= 48% |

Surprisingly, it has been found that layer stacks according to certain embodiments of this invention are characterized by rather low visible color shifts due to viewing angle (VA) change when viewed from the glass side of the article (e.g., from the exterior of the vehicle in FIG. 2). For example, Table 4 below illustrates the low $\Delta a*_g$ values associated with laminated coated articles of certain embodiments of this invention when viewed from a normal viewing angle (i.e., straight on) vs. a 60 degree off axis viewing angle. In other words, Table 4 below illustrates that according to certain embodiments of this invention $\Delta a*_g$ can be kept rather low even given a viewing angle (VA) shift of 60 degrees so that coated articles do not appear to change color to the naked eye when viewed at different angles. It is noted that $\Delta b*$ values are not deemed as important as $\Delta a*$ values, because a* changes are typically more noticeable to the naked human eye than are corresponding b* changes. In certain exemplary embodiments, $a*_g$ is within the range of -2.0 to +2.0 both before and after the 60 degree viewing angle (VA) shift, so that $a*_g$ remains proximate the b* axis (i.e., the b* axis is vertical blue(-)/yellow(+), while the a* axis is horizontal green(-)/red(+)) even through this radical change in viewing angle thereby minimizing the appearance of color change.

TABLE 4

Color Change with 60° Viewing Angle (VA) Change

| Characteristic | General | More Preferred | Best |
|---|---|---|---|
| $R_gY$ (normal VA): | <= 11% | <= 9% | <= 8% |
| $a*_g$ (normal VA): | -2.0 to +2.0 | -1.0 to +1.0 | -1.0 to 0.0 |
| $R_gY$ (60° VA): | <= 18% | <= 16% | <= 15% |
| $a*_g$ (60° VA): | -2.0 to +4.0 | 0.0 to +4.0 | 0.0 to 2.0 |
| $\Delta a*$ (60° VA change): | <= 3.0 | <= 2.0 | n/a |

It was mentioned above that the dual silver low-E coating system of U.S. Pat. No. 5,557,462 (i.e., glass/$Si_3N_4$/NiCr/Ag/NiCr/$Si_3N_4$/NiCr/Ag/NiCr/$Si_3N_4$) is not heat treatable at least because upon heat treatment $R_s$ goes way up, e.g., from about 3-5 to well over 10, and haze tends to set in. It is currently believed that if one were to significantly increase the thickness of the NiCr layers of the '462 patent in an attempt to achieve heat treatability, this would unfortunately result in visible transmittance going down well below 70% which would of course render the coated articles non-useable in vehicle windshield applications.

Figure 3A:
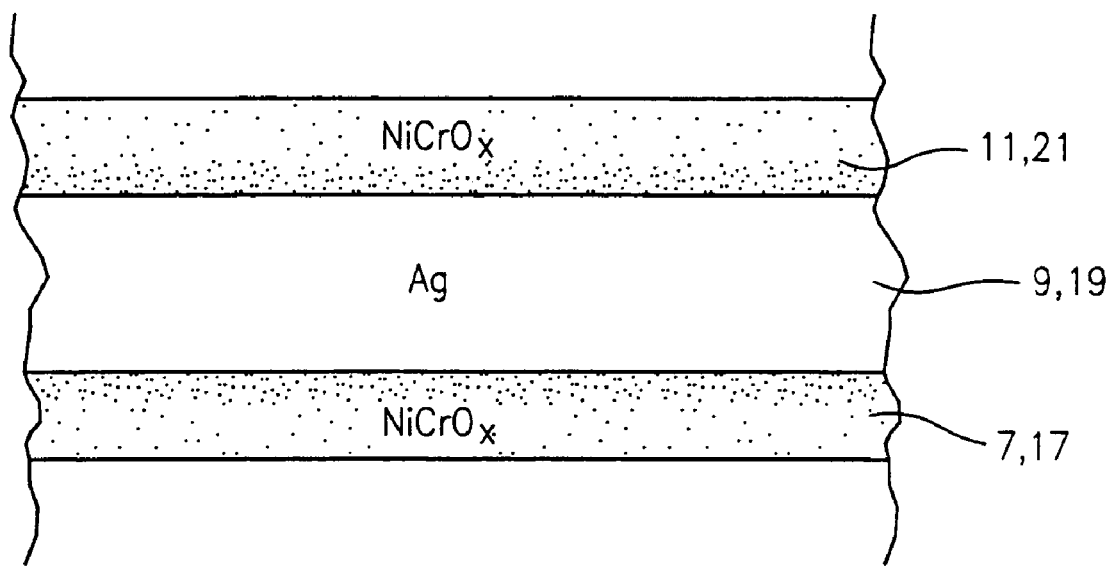
FIG. 3(a) is cross sectional view of a portion of a coating according to an embodiment of this invention illustrating a pair of oxidation graded contact layers (e.g., $NiCrO_x$ layers) surrounding an IR reflecting layer (e.g., Ag).
Figure 3B:
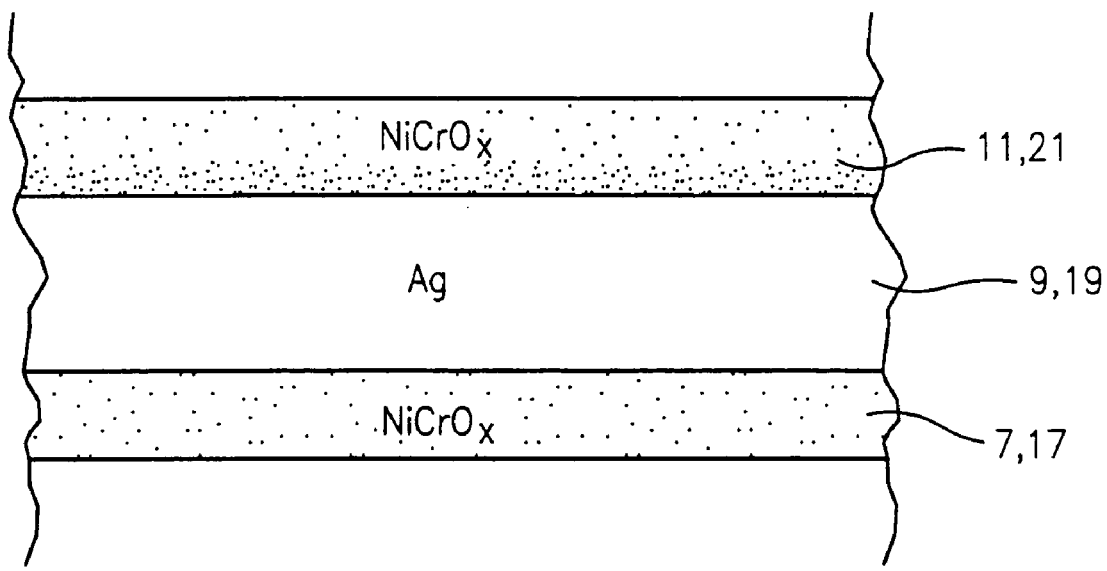
FIG. 3(b) is cross sectional view of a portion of a coating according to another embodiment of this invention illustrating an IR reflecting layer (e.g., Ag) surrounded by a pair of contact layers (e.g., $NiCrO_x$ layers), only one of which is oxidation graded.

However, it has surprisingly been found that by oxidation grading one or more of the non-crystalline contact layers 7, 11, 17, and/or 21, the resulting coated article can maintain high visible transmission, low-E characteristics including low $R_s$, and good durability upon heat treatment (e.g., tempering, heat bending, etc.). Reference is made to FIGS. 3(a) and 3(b) in this regard.

As shown in FIG. 3(a), both contact layers 7 and 11 (and/or 17 and 21) on either side of the applicable IR reflecting layer 9 (and/or 19) are oxidation graded so that they are less oxidized (including not oxidized at all in some optional embodiments) at the IR reflecting layer (e.g., Ag) interface. In other words, the two contact layers on either side of the Ag layer 9 are progressively less oxidized through their respective thicknesses as they near Ag layer 9. Accordingly, in certain embodiments of this invention, the portions (e.g., 5 Å thick portions) of layers 7 and 11 (or 17 and 21) closest to layer 9 (or 19) are from about 0 to 40% oxidized, more preferably from about 0 to 20% oxidized, and most preferably from about 0 to 10% oxidized. Meanwhile, the portions (e.g., 5 Å thick portions) of layer 7 and 11 (or 17 and 21) furthest from layer 9 (or 19) are at least about 50% oxidized, more preferably at least about 60% oxidized, even more preferably at least about 75% oxidized, and most preferably at least about 85% oxidized.

Thus, the contact layers become progressively less oxidized through their respective thicknesses as they approach the IR reflecting layer 9, 19. In certain embodiments, this causes the contact layers 7 and 11 (or 17 and 21) to be conductive or at least semi-conductive at the interface with the IR reflecting layer 9 (or 19), and substantially non-conductive at other parts of the layers 7 and 11 (or 17 and 21) such as in the 5 Å thick portion furthest from layer 9 (or 19). Thus, when the contact layers are of or include graded $NiCrO_x$, the x value progressively decreases through the thickness of the layer toward the IR reflecting layer 9, 19.

This value x may even approach or equal zero near the immediately adjacent IR reflecting layer in certain instances.

It is believed that the less oxidized portions of the contact layers 7 and 11 (and/or 17 and 21) near the IR reflecting layer 9 (or 19) interface enable the coating 27 to withstand heat treatment (HT) and provide good adhesion to layer 9, 19. However, these less (or no) oxidized portions of the contact layers are also less transparent to visible light than are the more oxidized portions of the contact layers. Thus, when oxidation graded: (a) the highly oxidized portions of graded contact layers 7 and 11 (and/or 17 and 21) are more transparent to visible light and enable the coating 27 to maintain its high visible transmission characteristics, while (b) the less oxidized portions of the graded contact layers better support the IR reflecting layer(s) 9, 19 during HT and provide good adhesion thereto, and enable the coating to withstand the same.

The FIG. 3(b) embodiment of this invention is similar to the FIG. 3(a) embodiment, except that only one of the contact layers contacting an IR reflecting layer is graded. In this particular embodiment, the upper contact layer(s) 11, 21 is oxidation graded as discussed above, while the lower one is not and is substantially oxidized, or at least about 50% oxidized. In certain embodiments of this invention, all four non-crystalline contact layers 7, 11, 17 and 21 may be oxidation graded in such a manner, while in other embodiments only the upper contact layers 11 and 21 may be graded. In still further embodiments of this invention, three of the contact layers may be graded, or alternatively only one of the contact layers may be oxidation graded. While $NiCrO_x$ is a preferred material for graded contact layers herein, it will be appreciated by those skilled in the art that other materials may instead be used (e.g., including but not limited to $NiCrO_xN_y$, nickel oxide, chromium oxide, nickel-alloy oxide, etc.), and may be oxidation graded to enable a dual silver coating system to maintain high transmission and good low-E characteristics even in view of HT.

Figure 4:
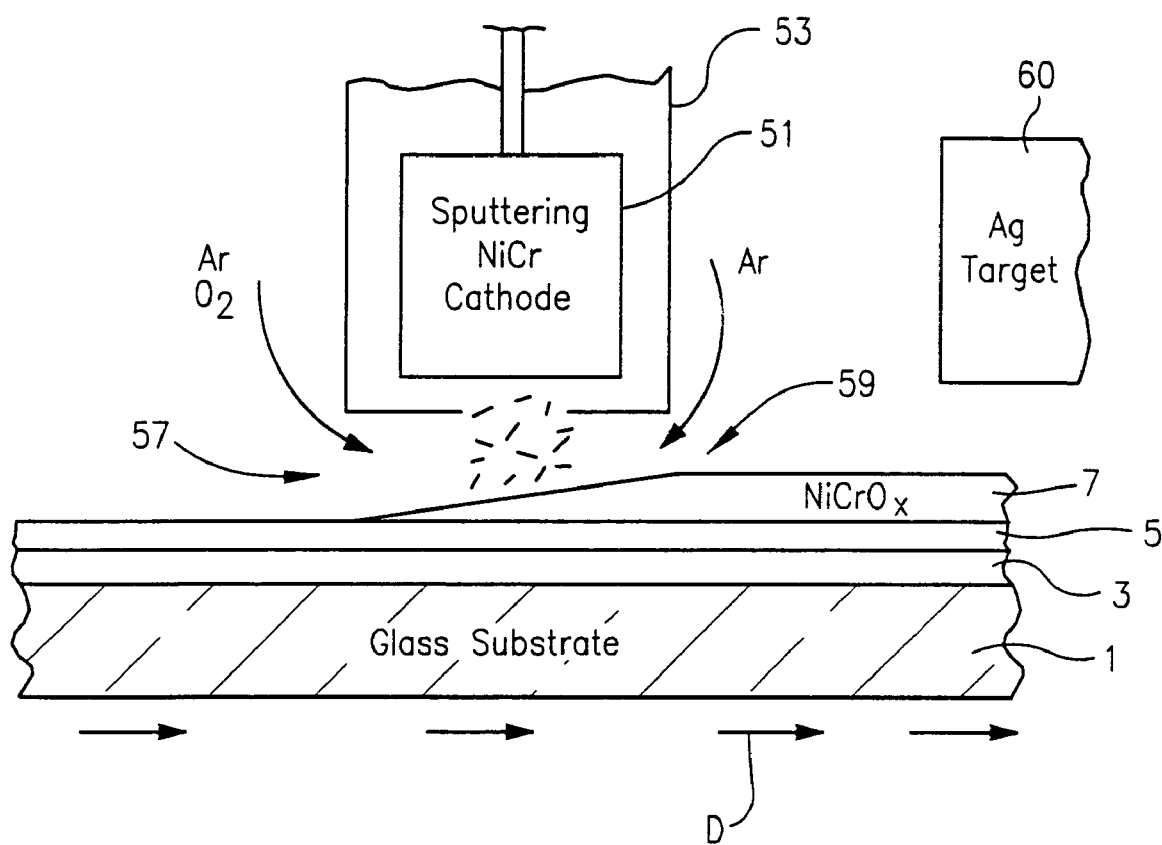
FIG. 4 is a schematic and partial cross sectional view illustrating how a graded contact layer (e.g., $NiCrO_x$ layer) is deposited via sputtering in accordance with an embodiment of this invention.

FIG. 4 illustrates how an oxidation graded contact layer 7, 17 may be deposited on a substrate as part of a coating according to an exemplary embodiment of this invention, using an asymmetric introduction of oxygen gas at a target area. Substrate 1 with part of a layer system thereon proceeds in direction D through the sputter coater. Sputtering cathode target 51 within shield 53 may comprise NiCr or any of the Ni inclusive targets discussed above when the contact layer (e.g., layer 7) is to be of or include $NiCrO_x$. Other metallic or ceramic targets may be used when other materials are to be used as contact layer(s). When the substrate 1 is moving in direction D beneath target 51, gas is introduced around the target on two sides 57 and 59 thereof. On one side 57 of target 51, at least oxygen (e.g., $O_2$) gas (e.g., oxygen flow of about 30-60 mL/min. at 4.1 kW), and optionally a mixture of oxygen and an inert gas such as argon (Ar), is fed into the coating zone beneath and/or proximate the target. However, on the other side 59 of target 51, less oxygen gas is used and more of another gas such as Ar is introduced into the coating zone beneath and/or proximate the target. For purposes of example, on side 57 of the target the gas flow may comprise any of (a) 100% oxygen, (b) a 70/30 mixture of oxygen/argon, (c) a 50/50 mixture of oxygen/argon, (d) a 30/70 mixture of oxygen/argon, or (e) a 50/25/25 mixture of oxygen/argon/nitrogen; while on the other side 59 of the target the gas flow may comprise any of (a) 100% argon or some other inert gas, (b) a 50/50 mixture of argon/nitrogen, or (c) a 90/10 mixture of argon/oxygen. Thus, there is more oxygen gas flow on side 57 of the target than on the other side 59. Thus, as the substrate 1 passes under the target 51, the first portion of layer 7 to be deposited is highly oxidized because of the presence of the oxygen gas on side 57 of the target, but the latter portion of layer 7 to be deposited is much less oxidized because of the lack of oxygen gas at the exit side 59 of the target. Thus, proximate target 51, the substrate first passes through an oxygen gas enriched sputter coating area and thereafter passes through an oxygen gas depleted sputter coating area having less oxygen gas. After layer 7 has been deposited in FIG. 4, the substrate moves on so that target 60 can be used to sputter coat layer 9 onto the substrate over the already deposited layers.

The amounts of oxygen and/or other gas(es) can of course be adjusted to oxidation grade contact layers in any desired manner. When it is desired to grade the contact layer(s) 11, 21 on the upper side of the IR reflecting layer 9, 19, the gas flow shown in FIG. 4 and described above is inverted so that the higher oxygen inclusive flow is at the exit side 59 of the target and the lower/no oxygen gas flow is at the entry side 57 of the target.

EXAMPLES 1-3

The following three Example coated articles were made in accordance with certain embodiments of this invention. For each of the three Examples, the coating/layer system 27 shown in FIG. 5 was sputtered onto a clear 2.1 mm thick large soda lime silica float glass substrate 1, and then cut into at least a 3"×3" sample. A Leybold Terra-G six-chamber sputter coating apparatus was used to sputter the coatings 27 onto the substrates 1. Five cathodes were in each chamber, so there were a total of 30 cathode targets in the sputter coater. Cathode numbering utilizes the first digit to refer to the coater chamber, and the second digit to refer to the cathode position in that chamber. For example, cathode # 32 was the second cathode (second digit) in the third (first digit) sputter chamber. Cathode #s C13, C14, C23, C62, C31, C32, C62, C64 and C65 were Twin Mag II type cathodes; cathode # C42 was a dual C-Mag type cathode; and cathode #s C44, C51, and C53 were planar cathodes. As will be appreciated by those skilled in the art, the first half of a coating 27 may be deposited in a sputter coater, and then the article may be again run through the coater to sputter the second half of the coating onto the substrate. In the sputter coater, layers 7-11 and 17-21 were sputtered onto the substrate using DC power sputtering, while the other layers were sputtered onto the substrate using a mid-frequency AC type system. Below, "*" means Al content of approximately 10%. The line speed for each Example was 2.6 meters per minute (m/min.). The coater/process setups for the three Examples are in Table 5. All gas flows (e.g., oxygen, argon, nitrogen) are presented in units of mL/minute. In the below examples, though not shown in the charts, the oxygen flow was turned off at the sides of the NiCr targets discussed above in order to oxidation grade the contact layers 11 and 21 as shown in FIG. 3(b) (i.e., only the two contact layers 11 and 21 above the respective silver layers were oxidation graded in these Examples). Volts refers to cathode volts, and amps (A) refers to cathode amps. "Tr" stands for trim; and trim (Tr) console, trim (Tr) Mid, and trim (Tr) pump are all measured in mL/minute. Pressure is measured in mbar x $10^{-3}$. Trim gas refers to individually adjusted gas flows along the cathode length to make corrections regarding layer thickness uniformity. The NiCr targets were approximately 80/20 NiCr. The process for each Example is broken into three separate charts (i.e., Part #s 1-3) because so much information is presented; only the cathode and target data is provided for all three charts in each example for ease of reference. Both silicon nitride layers 5 and 15 were Si-rich through their entire thickness(es); as can be seen by the fact that much more inert argon (Ar) gas than nitrogen gas was used in sputtering these silicon nitride layers.

TABLE 5

Coater Setup/Processes for Examples 1-3

EXAMPLE 1
EXAMPLE #1 (Part #1)

| Cathode | Target | Volts (V) | Power (kW) | Ar Flow (mL/min) | $O_2$ Flow (mL/min) | $N_2$ Flow |
|---|---|---|---|---|---|---|
| #13 | Ti | 743 | 73 | 200 | 25 | 80 |
| #14 | Ti | 703 | 64 | 200 | 35 | 50 |
| #23 | Ti | 738 | 63.5 | 200 | 35 | 50 |
| #42 | Si* | 456 | 29.7 | 225 | 0 | 165 |
| #44 | NiCr | 370 | 4.3 | 150 | 38 | 0 |
| #51 | Ag | 432 | 3.2 | 100 | 0 | 0 |
| #53 | NiCr | 386 | 4.1 | 150 | 48 | 0 |
| #62 | Sn | 431 | 18.3 | 200 | 240 | 100 |
| #31 | Sn | 477 | 24.2 | 200 | 290 | 100 |
| #32 | Sn | 428 | 24.5 | 200 | 300 | 100 |
| #42 | Si* | 453 | 30.2 | 225 | 0 | 165 |
| #44 | NiCr | 360 | 4.2 | 150 | 38 | 0 |
| #51 | Ag | 430 | 3.2 | 100 | 0 | 0 |
| #53 | NiCr | 380 | 4.1 | 150 | 48 | 0 |
| #62 | Sn | 442 | 18.4 | 200 | 240 | 100 |
| #64 | Si* | 554 | 40.6 | 200 | 0 | 200 |
| #65 | Si* | 545 | 40.3 | 250 | 0 | 200 |

EXAMPLE #1
(Part #2 continued from Part #1 above[cathode/target in common])

| Cathode | Target | Amps (A) | Tank Voltage (V) | Freq. (kHz) | Trim Gas |
|---|---|---|---|---|---|
| #13 | Ti | 128 | 364 | 26.7 | $O_2$ |
| #14 | Ti | 125 | 346 | 26.7 | $O_2$ |
| #23 | Ti | 110 | 344 | 26.5 | $O_2$ |
| #42 | Si* | n/a | 230 | 26.18 | $N_2$ |
| #44 | NiCr | 11.4 | 0 | 0 | Ar |
| #51 | Ag | 7.4 | 0 | 0 | Ar |
| #53 | NiCr | 10.7 | 0 | 0 | Ar |
| #62 | Sn | 45 | 203 | 25.03 | $O_2$ |
| #31 | Sn | 61 | 224 | 25.6 | $O_2$ |
| #32 | Sn | 60 | 225 | 25.64 | $O_2$ |
| #42 | Si* | n/a | 230 | 26.18 | $N_2$ |
| #44 | NiCr | 11.6 | 0 | 0 | Ar |
| #51 | Ag | 7.4 | 0 | 0 | Ar |
| #53 | NiCr | 10.5 | 0 | 0 | Ar |
| #62 | Sn | 42 | 208 | 25.1 | $O_2$ |
| #64 | Si* | 93.5 | 264 | 26.4 | $N_2$ |
| #65 | Si* | 93.5 | 273 | 26.2 | $N_2$ |

EXAMPLE #1
(Part #3 continued from Parts #1-2 above[cathode/target in common])

| Cathode | Target | Tr Console | Tr Mid | Tr Pump | Pressure | Lambda | Lambda active |
|---|---|---|---|---|---|---|---|
| #13 | Ti | 7.5 | 15 | 7.5 | 2.79E$^{-03}$ | 252 | True |
| #14 | Ti | 12.5 | 25 | 12.5 | 3.03E$^{-03}$ | 252 | True |
| #23 | Ti | 7.5 | 35 | 7.5 | 4.83E$^{-03}$ | 252 | True |
| #42 | Si* | 50 | 5 | 45 | 2.18E$^{-03}$ | 0 | False |
| #44 | NiCr | 15 | 70 | 15 | 2.26E$^{-03}$ | 0 | False |
| #51 | Ag | 15 | 70 | 15 | 1.37E$^{-03}$ | 0 | False |
| #53 | NiCr | 15 | 70 | 15 | 2.16E$^{-03}$ | 0 | False |
| #62 | Sn | 15 | 70 | 15 | 2.12E$^{-03}$ | 220 | True |
| #31 | Sn | 15 | 70 | 15 | 2.97E$^{-03}$ | 220 | True |
| #32 | Sn | 15 | 70 | 15 | 3.19E$^{-03}$ | 220 | True |
| #42 | Si* | 50 | 5 | 45 | 2.52E$^{-03}$ | 0 | False |
| #44 | NiCr | 15 | 70 | 15 | 2.30E$^{-03}$ | 0 | False |
| #51 | Ag | 15 | 70 | 15 | 1.44E$^{-03}$ | 0 | False |
| #53 | NiCr | 15 | 70 | 15 | 2.38E$^{-03}$ | 0 | False |
| #62 | Sn | 15 | 70 | 15 | 2.24E$^{-03}$ | 220 | True |
| #64 | Si* | 20 | 60 | 20 | 2.88E$^{-03}$ | 0 | False |
| #65 | Si* | 20 | 60 | 20 | 3.61E$^{-03}$ | 0 | False |

TABLE 5-continued

Coater Setup/Processes for Examples 1-3

EXAMPLE 2
EXAMPLE #2 (Part #1)

| Cathode | Target | Volts (V) | Power (kW) | Ar Flow (mL/min) | $O_2$ Flow (mL/min) | $N_2$ Flow |
|---|---|---|---|---|---|---|
| #13 | Ti | 729 | 74.6 | 200 | 25 | 80 |
| #14 | Ti | 703 | 66 | 200 | 35 | 50 |
| #23 | Ti | 738 | 63.5 | 200 | 35 | 50 |
| #42 | Si* | 451 | 29.7 | 225 | 0 | 165 |
| #44 | NiCr | 371.5 | 4.3 | 150 | 38 | 0 |
| #51 | Ag | 434 | 3.2 | 100 | 0 | 0 |
| #53 | NiCr | 390 | 4.1 | 150 | 48 | 0 |
| #62 | Sn | 427 | 18.4 | 200 | 240 | 100 |
| #31 | Sn | 476 | 24.6 | 200 | 290 | 100 |
| #32 | Sn | 427 | 25.3 | 200 | 300 | 100 |
| #42 | Si* | 458 | 29.3 | 225 | 0 | 165 |
| #44 | NiCr | 368 | 4.3 | 150 | 38 | 0 |
| #51 | Ag | 431 | 3.2 | 100 | 0 | 0 |
| #53 | NiCr | 386 | 4.1 | 150 | 48 | 0 |
| #62 | Sn | 436 | 18.4 | 200 | 240 | 100 |
| #64 | Si* | 552 | 40.6 | 200 | 0 | 200 |
| #65 | Si* | 548 | 40.6 | 250 | 0 | 200 |

EXAMPLE #2
(Part #2 continued from Part #1 above[cathode/target in common])

| Cathode | Target | Amps (A) | Tank Voltage (V) | Freq. (kHz) | Trim Gas |
|---|---|---|---|---|---|
| #13 | Ti | 146 | 364 | 26.7 | $O_2$ |
| #14 | Ti | 125 | 346 | 26.7 | $O_2$ |
| #23 | Ti | 110 | 344 | 26.5 | $O_2$ |
| #42 | Si* | n/a | 230 | 26.18 | $N_2$ |
| #44 | NiCr | 11.4 | 0 | 0 | Ar |
| #51 | Ag | 7.3 | 0 | 0 | Ar |
| #53 | NiCr | 10.3 | 0 | 0 | Ar |
| #62 | Sn | 45.5 | 203 | 25.03 | $O_2$ |
| #31 | Sn | 62 | 225 | 25.6 | $O_2$ |
| #32 | Sn | 61 | 226 | 25.64 | $O_2$ |
| #42 | Si* | n/a | 230 | 26.18 | $N_2$ |
| #44 | NiCr | 11.6 | 0 | 0 | Ar |
| #51 | Ag | 7.4 | 0 | 0 | Ar |
| #53 | NiCr | 10.5 | 0 | 0 | Ar |
| #62 | Sn | 44 | 206 | 25.1 | $O_2$ |
| #64 | Si* | 93.5 | 264 | 26.4 | $N_2$ |
| #65 | Si* | 93.5 | 273 | 26.2 | $N_2$ |

EXAMPLE #2
(Part #3 continued from Parts #1-2 above[cathode/target in common])

| Cathode | Target | Tr Console | Tr Mid | Tr Pump | Pressure | Lambda | Lambda active |
|---|---|---|---|---|---|---|---|
| #13 | Ti | 7.5 | 15 | 7.5 | 2.79E$^{-03}$ | 252 | True |
| #14 | Ti | 12.5 | 25 | 12.5 | 3.03E$^{-03}$ | 252 | True |
| #23 | Ti | 7.5 | 35 | 7.5 | 4.83E$^{-03}$ | 252 | True |
| #42 | Si* | 50 | 5 | 45 | 2.13E$^{-03}$ | 0 | False |
| #44 | NiCr | 15 | 70 | 15 | 2.26E$^{-03}$ | 0 | False |
| #51 | Ag | 15 | 70 | 15 | 1.35E$^{-03}$ | 0 | False |
| #53 | NiCr | 15 | 70 | 15 | 2.14E$^{-03}$ | 0 | False |
| #62 | Sn | 15 | 70 | 15 | 2.13E$^{-03}$ | 220 | True |
| #31 | Sn | 15 | 70 | 15 | 3.22E$^{-03}$ | 220 | True |
| #32 | Sn | 15 | 70 | 15 | 3.25E$^{-03}$ | 220 | True |
| #42 | Si* | 50 | 5 | 45 | 2.21E$^{-03}$ | 0 | False |
| #44 | NiCr | 15 | 70 | 15 | 2.26E$^{-03}$ | 0 | False |
| #51 | Ag | 15 | 70 | 15 | 1.39E$^{-03}$ | 0 | False |
| #53 | NiCr | 15 | 70 | 15 | 2.18E$^{-03}$ | 0 | False |
| #62 | Sn | 15 | 70 | 15 | 2.15E$^{-03}$ | 220 | True |
| #64 | Si* | 20 | 60 | 20 | 2.75E$^{-03}$ | 0 | False |
| #65 | Si* | 20 | 60 | 20 | 3.35E$^{-03}$ | 0 | False |

TABLE 5-continued

Coater Setup/Processes for Examples 1-3

EXAMPLE 3
EXAMPLE #3 (Part #1)

| Cathode | Target | Volts (V) | Power (kW) | Ar Flow (mL/min) | O₂ Flow (mL/min) | N₂ Flow |
|---|---|---|---|---|---|---|
| #13 | Ti | 743 | 73 | 200 | 25 | 80 |
| #14 | Ti | 703 | 64 | 200 | 35 | 50 |
| #23 | Ti | 738 | 63.5 | 200 | 35 | 50 |
| #42 | Si* | 456 | 29.7 | 225 | 0 | 165 |
| #44 | NiCr | 370 | 4.3 | 150 | 38 | 0 |
| #51 | Ag | 432 | 3.2 | 100 | 0 | 0 |
| #53 | NiCr | 386 | 4.1 | 150 | 48 | 0 |
| #62 | Sn | 431 | 18.3 | 200 | 240 | 100 |
| #31 | Sn | 481 | 25.2 | 200 | 290 | 100 |
| #32 | Sn | 439 | 25.9 | 200 | 300 | 100 |
| #42 | Si* | 449 | 30.4 | 225 | 0 | 165 |
| #44 | NiCr | 364 | 4.2 | 150 | 38 | 0 |
| #51 | Ag | 427 | 3.2 | 100 | 0 | 0 |
| #53 | NiCr | 383 | 4.0 | 150 | 48 | 0 |
| #62 | Sn | 452 | 19.5 | 200 | 240 | 100 |
| #64 | Si* | 553 | 40.6 | 200 | 0 | 200 |
| #65 | Si* | 545 | 40.3 | 250 | 0 | 200 |

EXAMPLE #3
(Part #2 continued from Part #1 above[cathode/target in common])

| Cathode | Target | Amps (A) | Tank Voltage (V) | Freq. (kHz) | Trim Gas |
|---|---|---|---|---|---|
| #13 | Ti | 128 | 364 | 26.7 | O₂ |
| #14 | Ti | 125 | 346 | 26.7 | O₂ |
| #23 | Ti | 110 | 344 | 26.5 | O₂ |
| #42 | Si* | n/a | 230 | 26.18 | N₂ |
| #44 | NiCr | 11.4 | 0 | 0 | Ar |
| #51 | Ag | 7.4 | 0 | 0 | Ar |
| #53 | NiCr | 10.7 | 0 | 0 | Ar |
| #62 | Sn | 45 | 203 | 25.03 | O₂ |
| #31 | Sn | 62 | 226 | 25.6 | O₂ |
| #32 | Sn | 62 | 229 | 25.64 | O₂ |
| #42 | Si* | n/a | 230 | 26.18 | N₂ |
| #44 | NiCr | 11.4 | 0 | 0 | Ar |
| #51 | Ag | 7.5 | 0 | 0 | Ar |
| #53 | NiCr | 10.5 | 0 | 0 | Ar |
| #62 | Sn | 45.4 | 212 | 25.1 | O₂ |
| #64 | Si* | 94 | 264 | 26.4 | N₂ |
| #65 | Si* | 93.5 | 273 | 26.2 | N₂ |

EXAMPLE #3
(Part #3 continued from Parts #1-2 above[cathode/target in common])

| Cathode | Target | Tr Console | Tr Mid | Tr Pump | Pressure | Lambda | Lambda active |
|---|---|---|---|---|---|---|---|
| #13 | Ti | 7.5 | 15 | 7.5 | 2.79E−03 | 252 | True |
| #14 | Ti | 12.5 | 25 | 12.5 | 3.03E−03 | 252 | True |
| #23 | Ti | 7.5 | 35 | 7.5 | 4.83E−03 | 252 | True |
| #42 | Si* | 50 | 5 | 45 | 2.18E−03 | 0 | False |
| #44 | NiCr | 15 | 70 | 15 | 2.26E−03 | 0 | False |
| #51 | Ag | 15 | 70 | 15 | 1.37E−03 | 0 | False |
| #53 | NiCr | 15 | 70 | 15 | 2.16E−03 | 0 | False |
| #62 | Sn | 15 | 70 | 15 | 2.12E−03 | 220 | True |
| #31 | Sn | 15 | 70 | 15 | 3.01E−03 | 220 | True |
| #32 | Sn | 15 | 70 | 15 | 3.24E−03 | 220 | True |
| #42 | Si* | 50 | 5 | 45 | 2.58E−03 | 0 | False |
| #44 | NiCr | 15 | 70 | 15 | 2.27E−03 | 0 | False |
| #51 | Ag | 15 | 70 | 15 | 1.41E−03 | 0 | False |
| #53 | NiCr | 15 | 70 | 15 | 2.37E−03 | 0 | False |
| #62 | Sn | 15 | 70 | 15 | 2.26E−03 | 220 | True |
| #64 | Si* | 20 | 60 | 20 | 2.90E−03 | 0 | False |
| #65 | Si* | 20 | 60 | 20 | 3.69E−03 | 0 | False |

After coating 27 of Examples 1-3 were sputtered onto respective substrates 1 in accordance with the above, they were tested/measured as follows in Table 6 (i.e. in a monolithic state). Heat treatment was performed by placing the coated articles into a furnace heated to about 625 degrees C. for about five (5) minutes.

TABLE 6

Exs. 1-3. Monolithic Before/After Heat Treatment (HT)

| Characteristic | Example 1 | Example 2 | Example 3 |
|---|---|---|---|
| $T_{vis}$ Ill. A, 2° (before HT): | >= 70% | >= 70% | >= 70% |
| $T_{vis}$ Ill. A, 2° (after HT): | >= 78% | >= 78% | >= 78% |
| $R_s$ (ohms/sq.)(before HT): | 4.43 | 4.37 | 4.27 |
| $R_s$ (ohms/sq.)(after HT): | 3.46 | 3.33 | 3.44 |
| $E_n$ (before HT): | <= 0.06 | <= 0.06 | <= 0.06 |
| $E_n$ (after HT): | <= 0.05 | <= 0.05 | <= 0.05 |
| Haze (after HT): | 0.15 | 0.28 | 0.22 |

Thereafter, the monolithic heat treated coated articles of Examples 1-3 were each laminated to another corresponding clear 2.1 mm thick 3 inch by 3 inch soda lime silica float glass substrate 1, with a layer of PVB (about 0.8 mm thick) being located between the substrates in a known manner, and coating 27 provided on the #2 surface as shown in FIG. 2. The resulting laminated coated articles (see FIG. 2) were then tested/measured and were found to exhibit the following characteristics set forth in Table 7. In Table 7, the glass (G) side is the same as outside the vehicle in FIG. 2, while the film (F) side is the same as the vehicle interior in FIG. 2.

TABLE 7

Color of Exs. 1-3 in Laminated Form Post-HT (i.e., as in FIG. 2)

| Value/Measurement | Example 1 | Example 2 | Example 3 |
|---|---|---|---|
| Ill. C, 2° | | | |
| Transmission (TY or $T_{vis}$) %: | 75.37 | 75.32 | 74.68 |
| $a^*_T$: | −2.92 | −3.17 | −2.25 |
| $b^*_T$: | 3.87 | 4.39 | 4.07 |
| Reflectance as viewed from glass (G) side: $R_GY$ (%): | 7.93 | 8.02 | 8.22 |
| $a^*_G$: | 0.53 | 0.93 | 0.29 |
| $b^*_G$: | −5.23 | −7.10 | −5.64 |
| Reflectance as viewed from film/coating (F) side: $R_FY$ (%): | 7.83 | 7.85 | 8.11 |
| $a^*_F$: | −1.59 | −1.23 | −1.68 |
| $b^*_F$: | −2.75 | −3.74 | −2.73 |
| Ill. D65, 2° | | | |
| Transmission (TY or $T_{vis}$) %: | 75.69 | 75.34 | 74.71 |
| $a^*_T$: | −2.81 | −3.05 | −2.16 |
| $b^*_T$: | 3.85 | 4.35 | 4.07 |
| Reflectance as viewed from glass (G) side: $R_GY$ (%): | 7.93 | 8.03 | 8.22 |
| $a^*_G$: | 0.26 | 0.57 | −0.01 |
| $b^*_G$: | −5.17 | −7.03 | −5.58 |
| Reflectance as viewed from film/coating (F) side: $R_FY$ (%): | 7.84 | 7.85 | 8.12 |
| $a^*_F$: | −1.79 | −1.48 | −1.88 |
| $b^*_F$: | −2.71 | −3.69 | −2.69 |
| Ill. A, 2° | | | |
| Transmission (TY or $T_{vis}$) %: | 75.27 | 75.23 | 74.78 |
| $a^*_T$: | −1.95 | −2.05 | −1.37 |
| $b^*_T$: | 3.28 | 3.74 | 3.68 |
| Ill. C, 10° | | | |
| Transmission (TY or $T_{vis}$) %: | 75.16 | 75.08 | 74.91 |
| $a^*_T$: | −2.39 | −2.59 | −2.78 |
| $b^*_T$: | 3.93 | 4.45 | 4.02 |
| Reflectance as viewed from glass (G) side: $R_GY$ (%): | 8.01 | 8.14 | 8.31 |
| $a^*_G$: | 0.11 | 0.28 | −0.15 |
| $b^*_G$: | −5.21 | −7.03 | −5.60 |

TABLE 7-continued

Color of Exs. 1-3 in Laminated Form Post-HT (i.e., as in FIG. 2)

| Value/Measurement | Example 1 | Example 2 | Example 3 |
|---|---|---|---|
| Reflectance as viewed from film/coating (F) side: $R_F Y$ (%): | 7.87 | 7.90 | 8.16 |
| $a^*_F$: | −1.54 | −1.30 | −1.62 |
| $b^*_F$: | −2.79 | −3.78 | −2.77 |
| Ill. D65, 10° | | | |
| Transmission (TY or $T_{vis}$) %: | 75.19 | 75.12 | 74.92 |
| $a^*_T$: | −2.29 | −2.49 | −2.66 |
| $b^*_T$: | 3.92 | 4.45 | 3.99 |
| Reflectance as viewed from glass (G) side: $R_G Y$ (%): | 8.01 | 8.14 | 8.31 |
| $a^*_G$: | −0.09 | 0.01 | −0.37 |
| $b^*_G$: | −5.20 | −7.02 | −5.58 |
| Reflectance as viewed from film/coating (F) side: $R_F Y$ (%): | 7.88 | 7.91 | 8.16 |
| $a^*_F$: | −1.69 | −1.49 | −1.78 |
| $b^*_F$: | −2.77 | −3.76 | −2.75 |
| Ill. A, 10° | | | |
| Transmission (TY or $T_{vis}$) %: | 75.20 | 75.15 | 74.85 |
| $a^*_T$: | −1.41 | −1.63 | −1.75 |
| $b^*_T$: | 3.34 | 3.98 | 4.02 |

Moreover, each of Examples 1-3 was found to be chemically and mechanically durable as these terms are defined below, both before and after HT.

As can be seen above, in depositing each of the silicon nitride layers, more Ar gas than N gas was used in the sputtering process. In the Examples the ratio Ar/N as about 225/165 (or 1.36) as can be seen above. In preferred embodiments of this invention the ratio Ar/N is from about 1.15 to 3.0, more preferably from about 1.20 to 2.0, and most preferably from about 1.2 to 1.5. This ratio which uses more of an inert gas (e.g., Ar) than nitrogen in sputtering the silicon nitride layers enables the resulting silicon nitride layers to be Si-rich as discussed above.

Table 8 below compares, for the HT laminate of Example 1, viewing characteristics at a normal viewing angle (VA) versus at a 60° off axis VA (i.e., the 60° VA is 60 degrees from the normal VA). As can be seen, Example 1 is characterized by substantial color stability over this wide range of viewing angles, so that a viewer looking at the laminate of Example 1 at both a normal VA (i.e., straight on so that the line or site is perpendicular to the plane of the article) and a 60° VA would not notice much if any color change. This is due to the low reflective Δa* value from the glass (G) side (i.e., Δa* means the difference between a* at the normal VA and the 60° off-axis VA). Note: the sixty degree color is Ill. D65, 10 degree standard observer.

TABLE 8

Color Change with 60° Viewing Angle (VA) Change (Ex. 1)

| Characteristic | Ex. 1 (Normal VA) | Ex. 1 (60° off-axis VA) |
|---|---|---|
| $T_{vis}$: | 75.27% | n/a |
| $a^*_T$: | −2.2 | n/a |
| $b^*_T$: | 4.2 | n/a |
| $T_{solar}$: | 46.75% | |
| $R_{solar}$: | 30.15 | 36.11 |
| $R_g Y$: | 7.8% | 14.56% |
| $a^*_g$: | −0.23 | 1.6 |
| $b^*_g$: | −5.59 | −1.33 |
| $\Delta a^*_g$ (60° VA change): | 1.83 | same |
| $\Delta L^*_g$ (60° VA change): | 11.4 | same |

As can be seen above in Table 8, $\Delta a^*_g$ (60° VA change) reflective in accordance with certain embodiments of this invention is preferably no greater than 3.0, and more preferably no greater than 2.0. In Table 8, it was 1.83. Moreover, $T_{solar}$ is preferably no greater than 50% in certain embodiments of this invention, even more preferably no greater than 48%, and most preferably no greater than about 47%.

Certain embodiments of this invention after heat treatment and lamination are characterized as follows regarding glass (G) side reflective color:

TABLE 9

| Parameter | Normal VA | 60° off-axis VA |
|---|---|---|
| a* | −2.0 to +2.0 | −2.0 to +3.0 |
| b* | −1.0 to −12.0 | 0 to −9.0 |

Certain terms are prevalently used in the glass coating art, particularly when defining the properties and solar management characteristics of coated glass. Such terms are used herein in accordance with their well known meaning. For example, as used herein:

Intensity of reflected visible wavelength light, i.e. "reflectance" is defined by its percentage and is reported as $R_x$ Y or R, (i.e. the Y value cited below in ASTM E-308-85), wherein "X" is either "G" for glass side or "F" for film side. "Glass side" (e.g. "G") means, as viewed from the side of the glass substrate opposite that on which the coating resides, while "film side" (i.e. "F") means, as viewed from the side of the glass substrate on which the coating resides.

Color characteristics are measured and reported herein using the CIE LAB 1976 a*, b* coordinates and scale (i.e. the CIE 1976 a*b* diagram, Ill. CIE-C 2 degree observer), wherein:

L* is (CIE 1976) lightness units a* is (CIE 1976) red-green units b* is (CIE 1976) yellow-blue units Other similar coordinates may be equivalently used such as by the subscript "h" to signify the conventional use of the Hunter method (or units) Ill. C, 10° observer, or the CIE LUV u*v* coordinates. These scales are defined herein according to ASTM D-2244-93 "Standard Test Method for Calculation of Color Differences From Instrumentally Measured Color Coordinates" Sep. 15, 1993 as augmented by ASTM E-308-95, Annual Book of ASTM Standards, Vol. 06.01 "Standard Method for Computing the Colors of Objects by 10 Using the CIE System" and/or as reported in IES LIGHTING HANDBOOK 1981 Reference Volume.

The terms "emissivity" (or emittance) and "transmittance" are well understood in the art and are used herein according to their well known meaning. Thus, for example, the term "transmittance" herein means solar transmittance, which is made up of visible light transmittance (TY of $T_{vis}$), infrared energy transmittance ($T_{IR}$), and ultraviolet light transmittance ($T_{uv}$). Total solar energy transmittance (TS or $T_{solar}$) can be characterized as a weighted average of these other values. With respect to these transmittances, visible transmittance may be characterized for architectural purposes by the standard Illuminant C, 2 degree technique; while visible transmittance may be characterized for automotive purposes by the standard Ill. A 2 degree technique (for these techniques, see for example ASTM E-308-95, incorporated herein by reference). For purposes of emissivity a particular infrared range (i.e. 2,500-40,000 nm) is employed. Various standards for calculating/measuring any and/or all of the above parameters may be found in the aforesaid provisional application upon which priority is claimed herein.

The term $R_{solar}$ refers to total solar energy reflectance (glass side herein), and is a weighted average of IR reflectance, visible reflectance, and UV reflectance. This term may be calculated in accordance with the known DIN 410 and ISO 13837 (12/98) Table 1, p. 22 for automotive applications, and the known ASHRAE 142 standard for architectural applications, both of which are incorporated herein by reference.

"Haze" is defined as follows. Light diffused in many directions causes a loss in contrast. The term "haze" is defined herein in accordance with ASTM D 1003 which defines haze as that percentage of light which in passing through deviates from the incident beam greater than 2.5 degrees on the average. "Haze" may be measured herein by a Byk Gardner haze meter (all haze values herein are measured by such a haze meter and are unitless).

"Emissivity" (or emittance) (E) is a measure, or characteristic of both absorption and reflectance of light at given wavelengths. It is usually represented by the formula:

$$E = 1 - \text{Reflectance}_{film}$$

For architectural purposes, emissivity values become quite important in the so-called "mid-range", sometimes also called the "far range" of the infrared spectrum, i.e. about 2,500-40,000 nm., for example, as specified by the WINDOW 4.1 program. LBL-35298 (1994) by Lawrence Berkeley Laboratories, as referenced below. The term "emissivity" as used herein, is thus used to refer to emissivity values measured in this infrared range as specified by ASTM Standard E 1585-93 entitled "Standard Test Method for Measuring and Calculating Emittance of Architectural Flat Glass Products Using Radiometric Measurements". This Standard, and its provisions, are incorporated herein by reference. In this Standard, emissivity is reported as hemispherical emissivity ($E_h$) and normal emissivity ($E_n$).

The actual accumulation of data for measurement of such emissivity values is conventional and may be done by using, for example, a Beckman Model 4260 spectrophotometer with "VW" attachment (Beckman Scientific Inst. Corp.). This spectrophotometer measures reflectance versus wavelength, and from this, emissivity is calculated using the aforesaid ASTM Standard 1585-93.

Another term employed herein is "sheet resistance". Sheet resistance ($R_s$) is a well known term in the art and is used herein in accordance with its well known meaning. It is here reported in ohms per square units. Generally speaking, this term refers to the resistance in ohms for any square of a layer system on a glass substrate to an electric current passed through the layer system. Sheet resistance is an indication of how well the layer or layer system is reflecting infrared energy, and is thus often used along with emissivity as a measure of this characteristic. "Sheet resistance" may for example be conveniently measured by using a 4-point probe ohmmeter, such as a dispensable 4-point resistivity probe with a Magnetron Instruments Corp. head, Model M-800 produced by Signatone Corp. of Santa Clara, Calif.

"Chemical durability" or "chemically durable" is used herein synonymously with the term of art "chemically resistant" or "chemical stability". Chemical durability is determined by boiling a 2"×5" sample of a coated glass substrate in about 500 cc of 5% HCl for 5 minutes (i.e. at about 220° F.). The sample is deemed to pass this test (and thus the layer system is "chemically resistant" or is deemed to be "chemically durable" or to have "chemical durability") herein if at least half of the sample's layer system remains after the 5 minutes.

"Mechanical durabilility" as used herein is defined by the following tests. The test uses a Pacific Scientific Abrasion Tester (or equivalent) wherein a 2"×4"×1" nylon brush (e.g., as made by Wright Bernet of Franklin Park, Ill., Model 1280 Hand & Nail Brush) is cyclically passed over the layer system in 500 cycles employing 150 gm of weight, applied to a 6"×17" sample. In this test, if no substantial, noticeable scratches appear when viewed with the naked eye under visible light, the test is deemed passed, and the article is said to be "mechanically durable" or to have "mechanical durability".

The terms "heat treatment" and "heat treating" as used herein mean heating the article to a temperature sufficient to enabling thermal tempering, bending, or heat strengthening of the glass inclusive article. This definition includes, for example, heating a coated article to a temperature of at least about 1100 degrees F. (e.g., to a temperature of from about 550 degrees C. to 900 degrees C.) for a sufficient period to enable tempering.

Once given the above disclosure many other features, modifications and improvements will become apparent to the skilled artisan. For example, and without limitation, the aforesaid oxidation graded contact layer(s) and Si-rich silicon nitride layer(s) can be used with single silver layer stacks, as well as the illustrated dual silver layer stacks. Such other features, modifications and improvements are therefore considered to be a part of this invention, the scope of which is to be determined by the following claims:

What is claimed is:

1. A coated article that is a vehicle windshield, comprising:
   a coating provided on a glass substrate, said coating comprising from the glass substrate outwardly:
   a) at least one dielectric layer;
   b) a first contact layer, and another layer provided between at least layers (a) and (b);
   c) a first IR reflecting layer comprising Ag;
   d) a second contact layer, said first IR reflecting layer contacting each of said first and second contact layers;
   e) at least one dielectric layer;
   f) a third contact layer;
   g) a second IR reflecting layer comprising Ag;
   h) a fourth contact layer, said second IR reflecting layer contacting each of said third and fourth contact layers;
   i) at least one dielectric layer, and another layer provided between at least layers (h) and (i);
   wherein after being heat treated (HT) and laminated in the form of a vehicle windshield said coated article has a visible transmittance of at least 70%, a $T_{solar}$ no greater than 50%, an $R_{solar}$ of at least 26%, a sheet resistance ($R_s$) of no greater than 8.0 ohms/sq, a glass side reflective color coordinate value $a^*_G$ (normal viewing angle) in the range of from −2.0 to +2.0; and wherein said glass side reflective color coordinate value $a^*_G$ does not change by more than 3.0 upon a 60° change in viewing angle (VA) from normal; and wherein said dielectric layer a) and/or said dielectric layer i) includes both Si and Zr and does not directly contact any contact layer, and wherein the metal portion of the dielectric layer a) and/or i), said metal portion not including Si because Si is a non-metal, consists of Zr.

2. The coated article of claim 1, further characterized after lamination and heat treatment by:

| Characteristic | Value Range |
|---|---|
| $R_gY$ (normal VA): | <= 11% |
| $R_gY$ (60° VA): | <= 18% |
| $a^*_g$ (60° VA): | −2.0 to +2.0 |
| $\Delta a^*$ (60° VA change): | <= 2.0 |

3. The coated article of claim 2, wherein after heat treatment and lamination said coated article has a reflective glass side b* value of from −1.0 to −12.0.

4. A coated article including a multi-layer coating supported by a glass substrate, the coating comprising from the substrate outwardly at least the following layers:
   a) a dielectric layer;
   b) a layer comprising zinc oxide, and another layer provided between at least layers (a) and (b);
   c) a first layer comprising silver;
   d) a layer comprising metal oxide;
   e) a second layer comprising silver;
   f) a contact layer;
   g) a layer comprising zinc oxide;
   h) a dielectric layer over and contacting the layer g);
   wherein the coated article has a visible transmission of at least 70%, a $T_{solar}$ no greater than 50%, and sheet resistance ($R_s$) no greater than 8 ohms/square; and
   wherein said dielectric layer h) includes both Si and Zr and does not contact any contact layer where a contact layer is a layer that contacts a layer comprising silver, and wherein the metal portion of the dielectric layer h), said metal portion not including Si because Si is a non-metal, consists of Zr.

5. The coated article of claim 4, wherein the coated article is heat treated, and is provided in the context of an IG unit or a vehicle windshield.

6. The coated article of claim 4, wherein the coated article has a glass side reflective color a* (normal viewing angle) of from −2 to +2.

7. The coated article of claim 4, wherein glass side reflective color value a* of the coated article does not change by more than 3.0 upon a 60 degree change in viewing angle from normal.

8. The coated article of claim 4, wherein the coated article is heat treated, and after heat treatment has a glass side reflective b* value of from −1.0 to −12.0.

9. The coated article of claim 4, wherein layer a) comprises a nitride of Si and Zr.

10. The coated article of claim 4, wherein layer h) further includes nitrogen.

* * * * *